(12) United States Patent
Chu et al.

(10) Patent No.: US 11,450,373 B2
(45) Date of Patent: Sep. 20, 2022

(54) MEMORY SYSTEM CAPABLE OF COMPENSATING FOR KICKBACK NOISE

(71) Applicant: Micron Technology, Inc., Boise, ID (US)

(72) Inventors: Wei Lu Chu, Shanghai (CN); Dong Pan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/003,163

(22) Filed: Aug. 26, 2020

(65) Prior Publication Data

US 2022/0068345 A1   Mar. 3, 2022

(51) Int. Cl.

| | |
|---|---|
| G11C 5/14 | (2006.01) |
| G11C 11/4074 | (2006.01) |
| G11C 11/4091 | (2006.01) |
| H03H 7/06 | (2006.01) |
| G11C 7/14 | (2006.01) |
| G05F 1/575 | (2006.01) |
| G11C 11/4063 | (2006.01) |

(52) U.S. Cl.
CPC .......... *G11C 11/4074* (2013.01); *G05F 1/575* (2013.01); *G11C 5/147* (2013.01); *G11C 7/14* (2013.01); *G11C 11/4063* (2013.01); *G11C 11/4091* (2013.01); *H03H 7/06* (2013.01)

(58) Field of Classification Search
CPC . G11C 11/4074; G11C 11/4063; G11C 5/147; G11C 7/14; G11C 11/4091; G05F 1/575
See application file for complete search history.

(56) References Cited

U.S. PATENT DOCUMENTS

| | | | |
|---|---|---|---|
| 7,372,748 B2* | 5/2008 | Nandi | G11C 16/30 327/540 |
| 2007/0070718 A1* | 3/2007 | Luo | G11C 5/147 365/189.09 |
| 2009/0302815 A1* | 12/2009 | Tanzawa | H02M 3/1584 323/282 |
| 2018/0137906 A1* | 5/2018 | Vimercati | G11C 11/2273 |
| 2020/0286574 A1* | 9/2020 | Kunz | G01R 19/16552 |
| 2021/0151086 A1* | 5/2021 | Lai | G11C 5/147 |

* cited by examiner

*Primary Examiner* — Mushfique Siddique
(74) *Attorney, Agent, or Firm* — Holland & Hart LLP

(57) ABSTRACT

Methods, systems, and devices for compensating for kickback noise are described. A regulator may include an input circuit, a bias circuit, and an enable circuit. The regulator may be configured so that the enable circuit is positioned between the input circuit and the bias circuit. A balance resistor may be included in a path between an input of the regulator and a gate of a bias transistor included in the bias transistor. A size of the balance resistor may be based on an amount of charge drawn by the bias transistor during an activation event. Dimensions of the bias transistor may be modified based on an amount of charge drawn by the bias transistor during an activation event.

28 Claims, 7 Drawing Sheets

MEMORY SYSTEM CAPABLE OF COMPENSATING FOR KICKBACK NOISE

BACKGROUND

The following relates generally to one or more systems for memory and more specifically to compensating for kickback noise.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. A memory device may include one or more regulators used to supply energy to components of the memory device at a configured voltage. A regulator may include an input circuit, a bias circuit, and an enable circuit. The regulator may produce kickback noise when the regulator is enabled for operation. Techniques for reducing the kickback noise generated by the regulator may be desired.

DETAILED DESCRIPTION

To reduce the amount of kickback noise introduced into a reference signal provided to an input of a regulator that is included in a memory device, an enhanced configuration may be used for the regulator. In some examples, a regulator may be configured so that the enable circuit is positioned (e.g., electrically and, sometimes, physically) between the input circuit and the bias circuit. By positioning the enable circuit between the input circuit and the bias circuit, a voltage at a source and/or drain of a transistor (which may be referred to as an "input transistor") of the input circuit may be decoupled from a voltage at a source and/or drain of a transistor (which may be referred to as a "bias transistor") of the bias circuit, and bi-directional changes in voltages applied across the parasitic capacitance of the input transistor and the bias transistor may occur. Thus, an amount of energy drawn from the reference signal by the parasitic capacitance of one of the transistors (e.g., the input or bias transistor) may be canceled by an amount of energy supplied to the reference signal by the parasitic capacitance of the other of the transistors, reducing the change in voltage of the reference signal when the enable circuit is activated.

In some examples, to improve the described cancellation effect, a resistance (which may be referred to as a "balance resistance") may be positioned (e.g., electrically and, sometimes, physically) between a conductive trace carrying the reference signal and a gate of the bias transistor. By introducing the balance resistance, an amount of energy drawn or supplied by the parasitic capacitance of the bias transistor may be reduced to better match (be closer to) the opposing amount of energy supplied or drawn by the parasitic capacitance of the input transistor. Additionally, or alternatively, to improve the cancellation effect, dimensions of the bias transistor may be modified (e.g., increased or decreased) so that an amount of energy drawn or supplied by the parasitic capacitance of the bias transistor better matches (is closer to) the opposing amount of energy supplied or drawn by the parasitic capacitance of the input transistor. Furthermore, by mitigating the effect of the input and bias transistors on the voltage of the reference signal, a resistance of a resistor included in a low pass filter used to protect the reference signal from changes in a global reference signal, and vice versa, may be reduced or omitted.

Features of the disclosure are initially described in the context of systems and dies as described with reference to FIGS. 1 and 2. Features of the disclosure are described in the context of a circuit and a timing diagram as described with reference to FIGS. 3 and 4. These and other features of the disclosure are further illustrated by and described with reference to an apparatus diagram and flowcharts that relate to compensating for kickback noise as described with reference to FIGS. 5 through 7.

Figure 1:
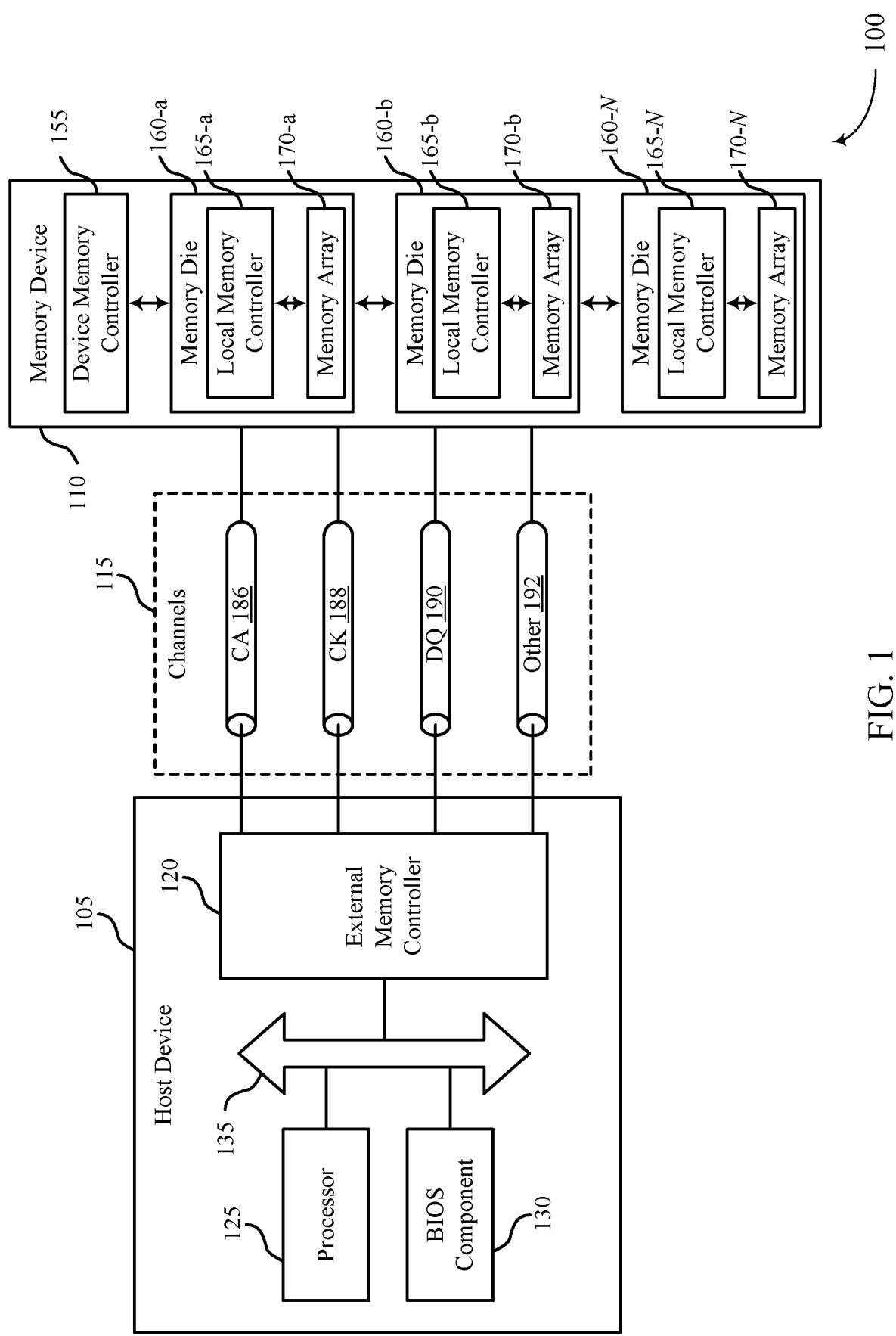
FIG. 1 illustrates an example of a system that supports compensating for kickback noise in accordance with examples as disclosed herein.

FIG. 1 illustrates an example of a system 100 that supports compensating for kickback noise in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory die 160 may include one or more regulators that are used to supply power to components for operating the memory die 160 at a designated voltage. The one or more regulators may include an input circuit, a biasing circuit, and an enable circuit. To reduce kickback noise, the regulator may use an enhanced configuration. In some examples, a regulator may be configured so that the enable circuit is positioned (e.g., electrically and, sometimes, physically) between the input circuit and the bias circuit. By positioning the enable circuit between the input circuit and the bias circuit, a voltage at a source and/or drain of an input transistor of the input circuit may be decoupled from a voltage at a source and/or drain of a bias transistor of the bias circuit, and bi-directional changes in voltages applied across parasitic capacitances of the input transistor and the bias transistor may occur.

Figure 2:
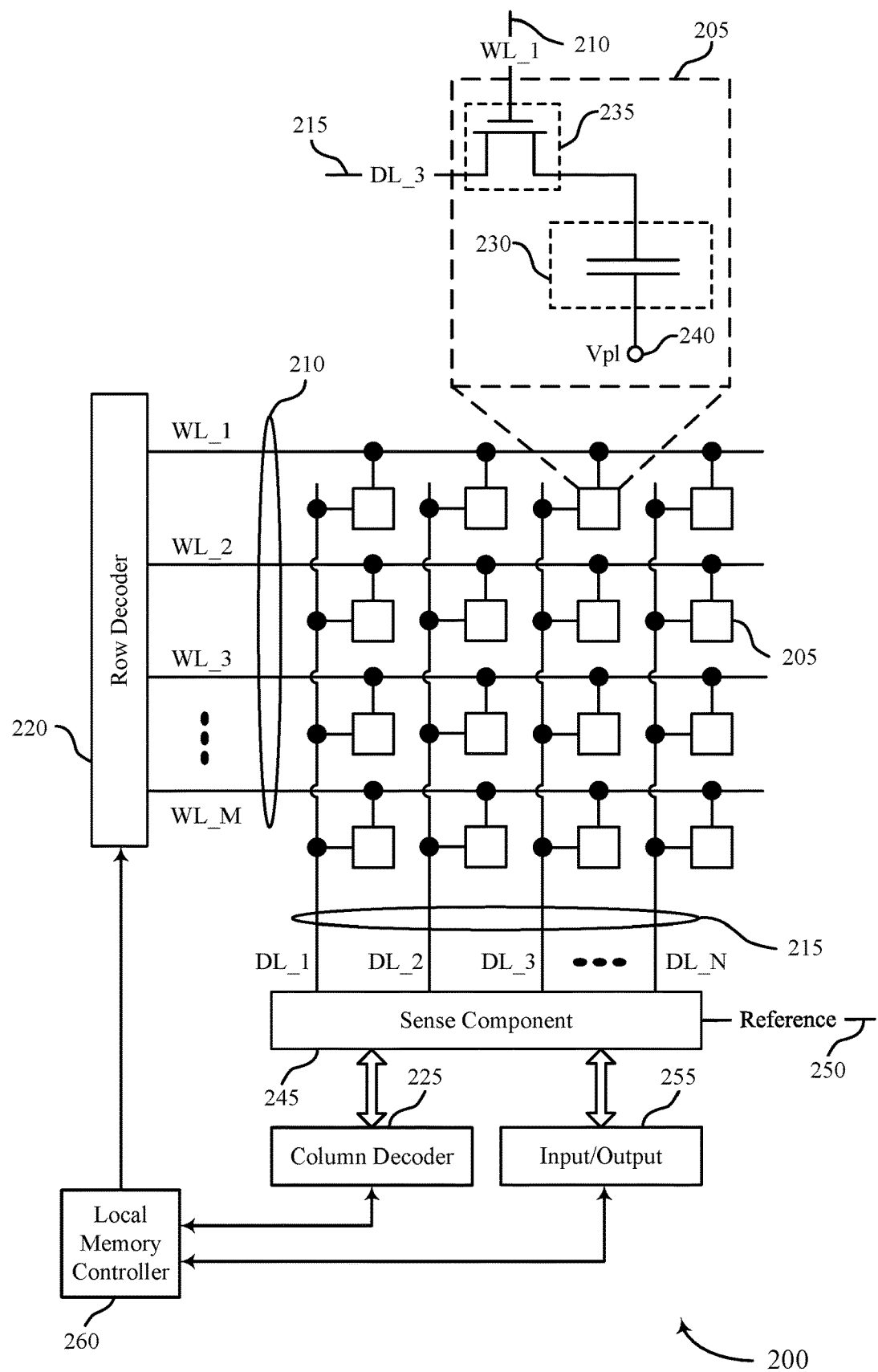
FIG. 2 illustrates an example of a memory die that supports compensating for kickback noise in accordance with examples as disclosed herein.

FIG. 2 illustrates an example of a memory die 200 that supports compensating for kickback noise in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations, such as reading and writing, may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

A memory die 200 may include one or more regulators that are configured to provide energy to other components at a designated voltage. In some examples, the one or more regulators may be configured to provide energy to access line drivers, decoders (e.g., row decoder 220) and/or sense component 245 at the designated voltage. The regulator may output a voltage based on a reference signal that is provided to an input of the regulator that is, the reference signal may control an output of the regulator. In some examples, the voltage output by the regulator may be equivalent (or within a percent range (e.g., ±1%) to the voltage of the reference signal.

In some examples, the memory die 200 may be partitioned into sections that include a subset of the memory cells, and a dedicated regulator may be used for each section. In some examples, a regulator is positioned within each section and the regulators are distributed across the memory die 200. In such cases, a global reference signal may be used as a reference signal for the regulators. In some examples, to protect the regulators from (e.g. reduce the effect of) variations in the global reference signal, low pass filters may be included in the paths between the global reference signal and the inputs of the different regulators that is, local reference signals may be produced at a location that is nearer to the regulators. The low pass filters may also serve to protect the global reference signal from (e.g. reduce the effect of) variations in one or more of the local reference signals.

A regulator may include a differential input circuit, a biasing circuit (or "bias circuit"), a loading circuit, and an output circuit. The differential input circuit may be used to receive and compare signals provided to the regulator—e.g., a reference signal and a signal output by the regulator. In some examples, one input of the differential input circuit (e.g., the negative input) may be coupled with the output of the regulator—that is, an operational amplifier portion of the regulator may be configured as a voltage follower. The biasing and loading circuits may be used to enable proper operation of the regulator—e.g., to ensure that the regulator outputs an expected voltage within a set of operating parameters. The bias circuit may be used to provide a bias current for the regulator. And the output circuit may be configured to supply energy at a voltage that is programmed for the regulator—e.g., by a reference signal.

In some examples, the regulator may also include an enable circuit that is configured to enable/disable (activate/deactivate) the operation of the regulator. That is, the regulator may be prevented from operating by the enable circuit even if a power and input signal is applied to the regulator. In some examples, the enable circuit is coupled with the bias circuit and prevents the bias circuit from biasing the regulator in an operational state. In such cases, the enable circuit may be positioned (electrically and, sometimes, physically) between the bias circuit and a voltage source—that is, the bias circuit, enable circuit, and voltage source may be connected in series. Additionally, the bias circuit may be positioned (electrically and, sometimes, physically) between the differential input circuit and the enable circuit—that is, the input circuit, bias circuit, enable circuit, and voltage source may be connected in series (in that order).

Enabling the operation of a powered regulator (e.g., by configuring the enable circuit to activate the regulator) may introduce noise (or kickback noise) into a reference signal that is provided to the regulator. In some examples, the kickback noise manifests as a transient change (e.g., a drop or rise) in a voltage of the reference signal. This kickback noise may be caused by transistors included in the input circuit and the bias circuit. More specifically, the kickback noise may be caused by parasitic capacitances that couple a gate and source of a transistor (which may be referred to as a gate-to-source capacitance ($C_gs$)) and a gate and drain of a transistor (which may be referred to as a gate-to-drain capacitance ($C_gd$)) as the reference signal may be used to charge (or may be charged by) the parasitic capacitances.

In some examples, the configuration of the regulator may affect the amount of kickback noise created by enabling an operation of the regulator. For example, when the input circuit, bias circuit, and enable circuit are connected in series, in that order, (that is, when the bias circuit is connected between the input circuit and enable circuit) the amount of kickback noise may be large—e.g., may cause a ~8 mV change in a voltage of the reference signal. This change in the voltage of the reference signal may be caused by the parasitic capacitances that couple the gates, sources, and drains of the transistors included in the input and bias circuits in addition to a uni-directional change in voltages applied across these parasitic capacitances. That is, when the regulator is enabled, the parasitic capacitances of the input circuit and bias circuit may be charged from (or discharged to) a conductive line carrying the reference signal. Thus, in some examples, a voltage of the reference signal may be discharged based on an amount of energy used to charge the parasitic capacitances (e.g., which may correspond to an ~8 mV drop in the reference signal voltage). Such a voltage drop may reduce a performance of memory components that are coupled with the regulator (e.g., by reducing a voltage that is output by the components, by decreasing a speed with which the components operate, and the like).

To reduce the amount of kickback noise introduced into the reference signal, an enhanced configuration may be used for a regulator included in a memory device. In some examples, a regulator may be configured so that the enable circuit is positioned (e.g., electrically and, sometimes, physically) between the input circuit and the bias circuit. By positioning the enable circuit between the input circuit and the bias circuit, a voltage at a source and/or drain of a transistor (which may be referred to as an input transistor) of the input circuit may be decoupled from a voltage at a source and/or drain of a transistor (which may be referred to as a bias transistor) of the bias circuit, and bi-directional changes in voltages applied across the parasitic capacitances of the input transistor and the bias transistor may occur. Thus, an amount of energy drawn from the reference signal by the parasitic capacitance of one of the transistors (e.g., the input or bias transistor) may be canceled by an amount of energy supplied to the reference signal by the parasitic capacitance of the other of the transistors, reducing the change in voltage of the reference signal when the enable circuit is activated.

In some examples, to improve the described cancellation effect, a resistance (which may be referred to as a balance resistance) may be positioned (e.g., electrically and, sometimes, physically) between a conductive trace carrying the reference signal and a gate of the bias transistor. By introducing the balance resistance, an amount of energy drawn or supplied by the parasitic capacitance of the bias transistor may be reduced to better match (be closer to) the opposing amount of energy supplied or drawn by the parasitic capacitance of the input transistor. Additionally, or alternatively, to improve the cancellation effect, dimensions of the bias transistor may be modified (e.g., increased or decreased) so that an amount of energy drawn or supplied by the parasitic capacitance of the bias transistor better matches (is closer to) the opposing amount of energy supplied or drawn by the parasitic capacitance of the input transistor. Furthermore, by mitigating the effect of the input and bias transistors on the voltage of the reference signal, a resistance of a resistor included in a signal filter used to protect the reference signal from changes in a global reference signal, and vice versa, may be reduced or omitted.

Figure 3:
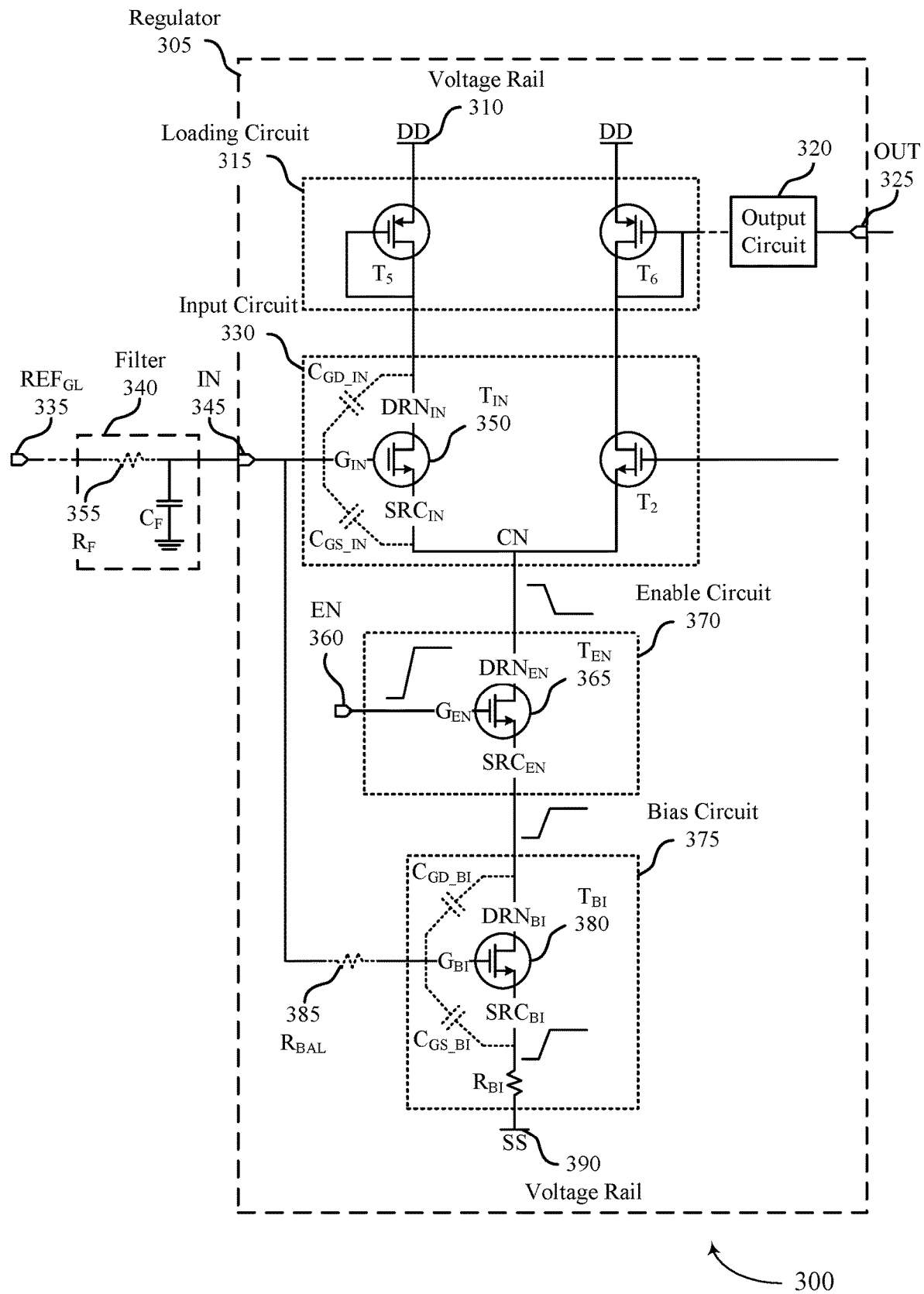
FIG. 3 illustrates an example of a circuit that supports compensating for kickback noise in accordance with examples as disclosed herein.

FIG. 3 illustrates an example of a circuit that supports compensating for kickback noise in accordance with examples as disclosed herein.

Circuit 300 may be an example of circuit that is part of a memory device 110 or memory die 200, as described with reference to FIGS. 1 and 2. Circuit 300 may include global reference input 335, filter 340, and regulator 305. In some examples, circuit 300 includes multiple memory sections, where a filter and regulator may be included in each section. Filter 340 and regulator 305 may be coupled with (and/or included in) one of the multiple memory sections.

Global reference input 335 may be configured to receive a reference signal for one or more regulators (including regulator 305). The reference signal may be referred to as a global reference signal. A voltage of the signal received at global reference input 335 may be used to control a voltage of the one or more regulators—e.g., the voltages output by the one or more regulators may be equivalent to (or within a percent range, e.g., within ±1%, of) the voltage of the global reference signal.

Filter 340 may be configured to protect an input of regulator 305 from transients in an input signal (e.g., the global reference signal) received at filter 340. Filter 340 may similarly be configured to protect the global reference signal received at the input of filter 340 from transients in a reference signal (e.g., a local reference signal) received at an input of regulator 305. Filter 340 may be a low-pass filter. Filter 340 may include filter resistor 355 (which may also be referred to as RF) and a filter capacitor (which may also be referred to as $C_F$). In some examples, the values of filter resistor 355 and filter capacitor determine which frequencies will be filtered out by filter 340. That is, filter resistor 355 and filter capacitor may be used to filter out transients in a signal received at the input of filter 340. For example, the filter resistor and filter capacitor may be used to filter out high frequencies—e.g., frequencies greater than 150 kilohertz (kHz) transients in the signal received at the input of filter 340. In some examples, a capacitance of the filter capacitor is between 6 and 12 picofarads (pF) and a resistance of filter resistor is between 80 and 120 kiloohms (KΩ). As described herein, in some examples, the resistance of filter resistor may be less than 10 KΩ.

Regulator 305 may be configured to supply energy to one or more components (e.g., sensing components, such as access line drivers and sensing components) in memory device at a designated voltage. In some examples, the designated voltage may be a function of a voltage of the reference signal received at signal input 345 of regulator 305—e.g., the designated voltage may be equivalent to (or within a percent range, e.g., within ±1%, of) the reference signal received at signal input 345. Regulator 305 may include signal input 345, loading circuit 315, input circuit 330, enable input 360, enable circuit 370, bias circuit 375, output circuit 320, signal output 325, high voltage rail 310, and low voltage rail 390. In some examples, regulator 305 may also include balance resistor 385 (which may also be referred to as $R_{BAL}$).

Signal input 345 may be configured to receive an input signal (e.g., a global or local reference signal). Signal input 345 may be a conductive pin or pad that is a part of, or coupled with, regulator 305.

Loading circuit 315 may be configured to provide a load for input circuit 330 and to improve a performance of regulator 305. Loading circuit 315 may include two transistors (which may be referred to as $T_5$ and $T_6$) that are configured in a diode-connected configuration, in which an amount of current through the transistors increases as a voltage of a respective drain of the two transistors decreases.

Input circuit 330 may be configured to receive a reference signal and compare a difference between the reference signal and another signal. Input circuit 330 may include input transistor 350 and a second transistor (which may be referred to as $T_2$) that have a common node (which may be referred to as CN) and are configured as a differential pair. Input transistor 350 may be configured to receive a reference signal (e.g., a global or local reference signal). Input transistor 350 may include parasitic capacitances between the gate, drain, and source of input transistor 350. The parasitic capacitance between the gate and drain of input transistor 350 may be referred to as $C_{GD\_IN}$ and the parasitic capacitance between the gate and source of input transistor 350 may be referred to as $C_{GS\_IN}$. One or both of the parasitic capacitances may be charged when input transistor 350 is activated but may not otherwise affect an operation of regulator 305 during subsequent (e.g., normal) operation. The second transistor may be configured to receive an output signal generated by regulator 305. Regulator 305 may be configured to cause a voltage of the output signal applied to the second transistor to match a voltage of the reference signal applied to the first transistor.

Enable input 360 may be configured to receive an enable signal for regulator 305. Enable input 360 may be a conductive pin or pad that is a part of, or coupled with, regulator 305.

Enable circuit 370 may be configured to disable or enable an operation of regulator 305 based on a voltage of the enable signal—e.g., while regulator 305 is receiving power. Enable circuit 370 may enable the operation of regulator 305 by permitting current to flow through bias circuit 375. Enable circuit 370 may include enable transistor 365. Enable transistor 365 may be configured to receive the enable signal and may be activated (that is, may provide a conductive path from input circuit 330 to bias circuit 375) when a voltage of the enable signal is above a threshold.

Bias circuit 375 may be configured to bias regulator 305 to ensure proper operation of regulator 305. Bias circuit 375 may provide a bias current for regulator 305. A speed with which regulator 305 reacts to changes in a reference signal may be based on a magnitude of the bias current—e.g., regulator 305 may react more quickly if the bias current is larger. Bias circuit 375 may include bias transistor 380 and a bias resistor (which may be referred to as RBI). Bias transistor 380 may be configured to receive a signal received at signal input 345 (e.g., a global or local reference signal). Bias transistor 380 may include parasitic capacitances between the gate, drain, and source of input transistor 350. The parasitic capacitance between the gate and drain of input transistor 350 may be referred to as $C_{GD\_BI}$ and the parasitic capacitance between the gate and source of input transistor 350 may be referred to as $C_{GS\_BI}$. The parasitic capacitances may be charged when bias transistor 380 is activated and may not otherwise affect an operation of regulator 305 during subsequent operation. A bias current generated by bias circuit 375 may be based on a voltage of the reference signal, a threshold voltage of bias transistor 380, and a size of the bias resistor.

Output circuit 320 may be configured to supply energy to or sink energy from one or more coupled components (e.g., access line drivers, sense components, and the like) based on the comparison performed by input circuit 330. For example, if a voltage of the reference signal received at input transistor 350 is greater than a voltage of a signal received at the second transistor (T2), output circuit 320 may output a high voltage. Output circuit 320 may output a low voltage if a voltage of the reference signal received at input transistor 350 is greater than a voltage of a signal received at the second transistor (T2). Moreover, when regulator 305 is configured as a voltage follower (that is, when an output of regulator 305 is coupled with a gate of the second transistor (T2), output circuit 320 may output an output signal having a voltage that matches (or closely matches, e.g., within 1%) a voltage of the reference signal received at input transistor 350.

Signal output 325 may be configured output an output signal that is used to provide energy to (or power) other components in a memory device that are coupled with signal output 325. Signal output 325 may be a conductive pin or pad that is a part of, or coupled with, regulator 305.

High voltage rail 310 may be configured to carry a power signal that has a higher voltage than a power signal carried by low voltage rail 390. High voltage rail 310 may have a positive voltage. In some examples, high voltage rail 310 may have a negative voltage that is smaller in magnitude than a negative voltage of low voltage rail 390. In some examples, a voltage of high voltage rail 310 may be referred to as $V_{DD}$.

Low voltage rail 390 may be configured to carry a power signal that has a lower voltage than a power signal carried by high voltage rail 310. Low voltage rail 390 may have a negative voltage or a reference voltage (which may be referred to as a ground voltage, a virtual ground voltage, or 0 V). In some examples, a voltage of low voltage rail 390 may be referred to as Vss.

As depicted in FIG. 3, enable circuit 370 may be positioned (electrically and, sometimes, physically) between input circuit 330 and bias circuit 375. That is, input circuit 330, enable circuit 370, and bias circuit 375 may be connected in series. As described herein, positioning the enable circuit 370 between input circuit 330 and bias circuit 375 may reduce an amount of kickback noise introduced into a reference signal received at signal input 345 when enable circuit 370 is activated (that is, when enable circuit 370 establishes a conductive path between input circuit 330 and bias circuit 375) relative to positioning the bias circuit 375 between input circuit 330 and enable circuit 370. That is, by swapping a position of enable circuit 370 and bias circuit 375 (as compared with other implementations), an amount of kickback noise in the reference signal may be reduced. Noise in the reference signal may affect a voltage of the output signal output by regulator 305, which may reduce a performance of components that are powered by regulator 305.

The position of enable circuit 370 may cause the amount of kickback noise to be reduced by canceling an amount of kickback noise produced by input transistor 350 and an amount of kickback noise produced by bias transistor 380. That is, positioning the enable circuit 370 between input circuit 330 and bias circuit 375 may decouple a voltage of a source of input transistor 350 ($V_{SRC\_IN}$) and a voltage of a drain of bias transistor 380 ($V_{DRN\_BI}$). Thus, when enable circuit 370 is disabled, $V_{SRC\_IN}$ may be equivalent to $V_{DD}$ and $V_{DRN\_BI}$ may be equivalent to Vss. Then, when enable circuit 370 is subsequently enabled, $V_{SRC\_IN}$ may fall to a lower voltage than $V_{DD}$ and $V_{DRN\_BI}$ may rise to a higher voltage than Vss. In some examples, after enable circuit 370 is enabled, $V_{SRC\_IN}$ may be equivalent (or close) to $V_{DRN\_BI}$. In other examples, $V_{SRC\_IN}$ may be different than $V_{DRN\_BI}$.

Accordingly, a voltage across a gate and source of input transistor 350 (which may be referred to as $V_{GS\_IN}$) and, in some examples, a gate and drain of input transistor 350 (which may be referred to as $V_{GD\_IN}$) may change in a first (e.g., positive) direction. And a first amount of charge may be drawn into $C_{GS\_IN}$ and, in some examples, $C_{GD\_IN}$. Concurrently, a voltage across a gate and source of bias transistor 380 (which may be referred to as $V_{GS\_BI}$) and a gate and drain of input transistor 350 (which may be referred to as $V_{GD\_BI}$) may change in a second (e.g., a negative) direction. And a first amount of charge may be released from $C_{GD\_BI}$ and $C_{GS\_BI}$. Thus, a voltage of the reference signal received at signal input 345 may be decreased based on the amount of charge drawn into $C_{GD\_IN}$ and $C_{GS\_IN}$ and simultaneously increased by the amount of charge released from $C_{GD\_BI}$ and $C_{GS\_BI}$.

By contrast, if a position of enable circuit 370 and bias circuit 375 are swapped (as compared to what is shown in FIG. 3), then $V_{SRC\_IN}$ would equal $V_{DRN\_BI}$, and $V_{GS\_IN}$, $V_{GD\_BI}$, and $V_{GS\_BI}$ (and in some examples $V_{GD\_IN}$) may all change in the first direction (e.g., the negative direction) when enable circuit 370 is activated. Thus, a first amount of charge would be drawn into $C_{GS\_IN}$ and, in some examples, $C_{GD\_IN}$, and a second amount of charge would be drawn into $C_{GS\_BI}$ and $C_{GD\_BI}$, and a voltage of the reference signal received at signal input 345 would be decreased based on the total amount of charge drawn into $C_{GS\_IN}$, $C_{GS\_BI}$, and $C_{GD\_BI}$ (and in some examples $C_{GD\_IN}$).

In some examples, the dimensions of bias transistor 380 may be configured to improve the cancellation effect of the input transistor 350 and the bias transistor 380 when enable circuit 370 is positioned between input circuit 330 and bias circuit 375. That is, the dimensions of bias transistor 380 may be modified to increase or decrease a size of $C_{GS\_BI}$ and $C_{GD\_BI}$ to increase or decrease the amount of current released from $C_{GS\_BI}$ and $C_{GD\_BI}$ when enable circuit 370 is activated—e.g., so that the amount of current released from $C_{GS\_BI}$ and $C_{GD\_BI}$ more closely matches the amount of current that is concurrently drawn in by $C_{GD\_IN}$ (if any) and $C_{GS\_IN}$. In some examples, the dimensions (e.g., a width and/or length) of bias transistor 380 may be modified so that the amount of current released from $C_{GS\_BI}$ and $C_{GD\_BI}$ is within a percent range (e.g., ±1%) of the amount of current that is concurrently drawn in by $C_{GS\_IN}$ and, in some examples, $C_{GD\_IN}$. In some examples, the dimensions of bias transistor 380 are modified while maintaining (or roughly maintaining) proportionality between the width and length of bias transistor 380—e.g., to ensure that an equivalent or similar bias current is supplied by bias circuit 375.

To additionally, or alternatively, improve the cancellation effect of the input transistor 350 and the bias transistor 380 when enable circuit 370 is positioned between input circuit 330 and bias circuit 375, balance resistor 385 may be included in regulator 305. Balance resistor 385 may be used to reduce the amount of charge released from $C_{GS\_BI}$ and $C_{GD\_BI}$ so that the amount of charge released from $C_{GS\_BI}$ and $C_{GD\_BI}$ better matches the amount of charge drawn into $C_{GD\_IN}$ (if any) and $C_{GS\_IN}$.

Moreover, as a result of reducing the kickback noise using one or more of the techniques described herein, a size of filter resistor 355 may be reduced, or filter resistor 355 may be omitted entirely. That is, the protection provided to the global reference signal received at global reference input 335 by filter resistor 355 from noise in the local reference signal received at signal input 345 may lose importance as the kickback noise in the local reference signal is reduced. Thus, the size of filter resistor 355 may be reduced or omitted. In some examples, filter resistor 355 may have a resistance that is less than 10 KΩ. By reducing a size of filter resistor 355, a voltage of a local reference signal may more closely track a voltage of the global reference signal.

Although described in the context of a regulator that uses p-FET transistors for loading circuit 315 and n-FET transistors for input circuit 330, enable circuit 370, and bias circuit 375, the above discussion is similarly applicable to regulators that use n-FET transistors for a similar loading circuit and p-FET transistors for a similar input circuit, enable circuit, and bias circuit. In such cases, the regulator may be configured so that the high voltage rail, the bias circuit, the enable circuit, and the input circuit (in that order) are connected in series—that is, the enable circuit may similarly be positioned between the bias circuit and the input circuit.

Figure 4:
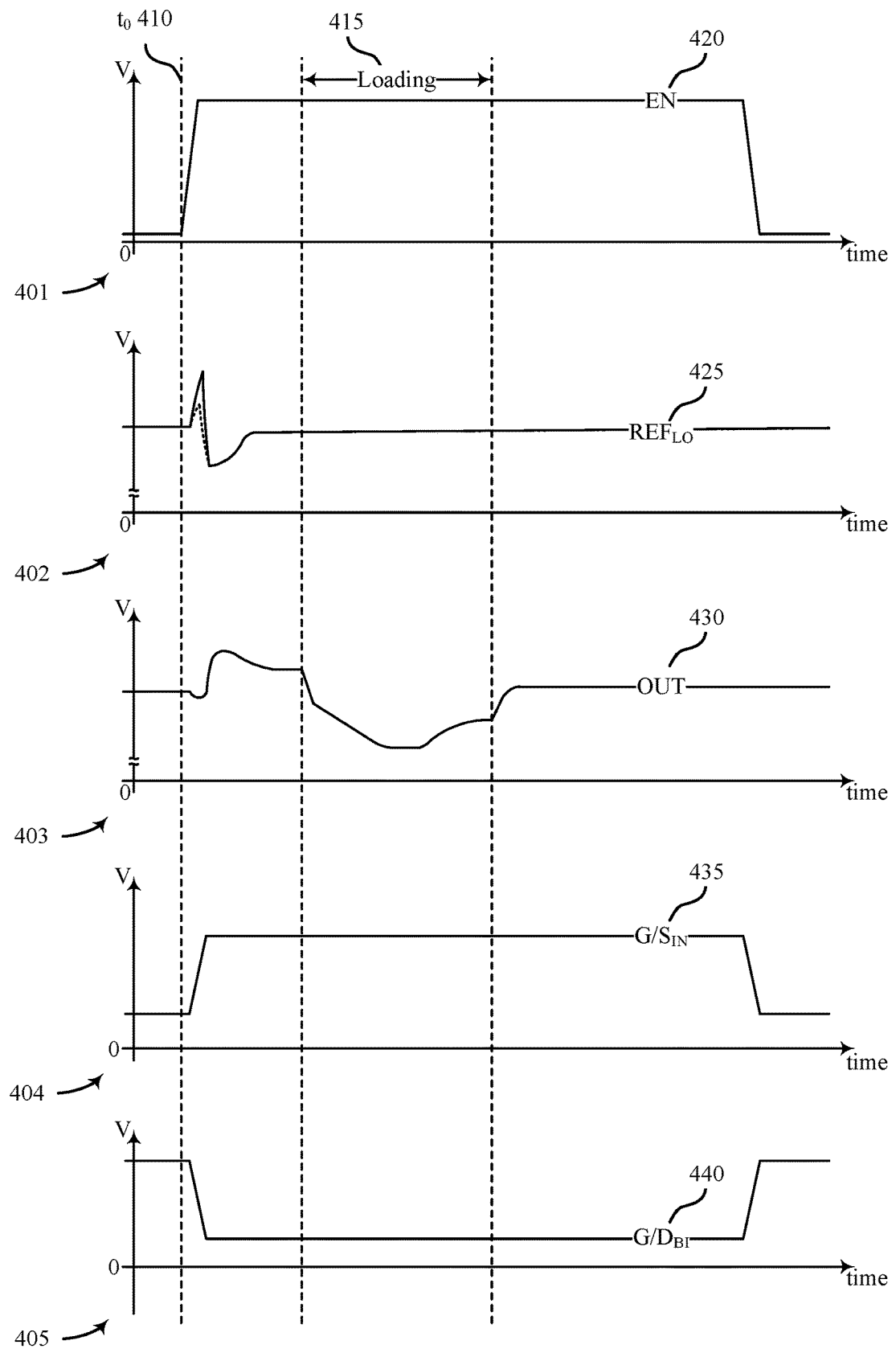
FIG. 4 illustrates an example of a timing diagram that supports compensating for kickback noise in accordance with examples as disclosed herein.

FIG. 4 illustrates an example of a timing diagram that supports compensating for kickback noise in accordance with examples as disclosed herein.

Signal diagram 400 depicts a voltage of multiple signals within a regulator (e.g., regulator 305 of FIG. 3) over a time period. Signal diagram 400 includes enable signal diagram 401, reference signal diagram 402, output signal diagram 403, gate-to-source (G/S) signal diagram 404, and gate-to-drain (G/D) signal diagram 405.

Enable signal diagram 401 may depict a voltage of an enable signal 420 that is received at an enable circuit (e.g., at enable input 360 of enable circuit 370 of FIG. 3). Reference signal diagram 402 may depict a voltage of a local reference signal 425 received at an input circuit and a bias circuit (e.g., at signal input 345 of input circuit 330 and bias circuit 375 of FIG. 3). Output signal diagram 403 may depict a voltage of an output signal 430 that is output by a regulator (e.g., regulator 305 of FIG. 3).

G/S signal diagram 404 may depict a voltage of a G/S signal 435 that is applied across a gate and source of a transistor of an input circuit and/or a voltage that is applied across a G/S capacitance of the input transistor (which may be referred to as $C_{GS\_IN}$) (e.g., input transistor 350 of input circuit 330 of FIG. 3). G/D signal diagram 405 may depict a voltage of a G/D signal 440 that is applied across a gate and drain of a transistor of a bias circuit and/or a voltage that is applied across a G/D capacitance of the bias transistor (which may be referred to as $C_{GD\_BI}$ (e.g., bias transistor 380 of bias circuit 375 of FIG. 3).

At initial time 410 (which may also be referred to as t0), enable signal 420 may transition from a low to a high voltage, causing a enable transistor (e.g., enable transistor 365 of FIG. 3) to enter a saturation region. As the enable transistor enters the saturation region, a voltage at a source of the input transistor may transition to a lower voltage, causing G/S signal 435 to increase. And a voltage at a source and drain of the bias transistor may transition to a higher voltage, causing G/D signal 440 to decrease. The negative change in voltage across the gate and drain and gate and source of the bias transistor (and, thus, across a G/D capacitance and G/S capacitance of the bias transistor) may cause an amount of charge to be released from these capacitances to local reference signal 425. Thus, the voltage of local reference signal 425 may be pushed up. Concurrently, the positive change in voltage across the gate and source of the input transistor (and, thus, across a G/S capacitance of the input transistor) may cause an amount of charge to be drawn into the G/S capacitance from local reference signal 425. Thus, the voltage of local reference signal 425 may be pulled down. The charge released from and drawn into the capacitances may manifest as kickback noise on local reference signal 425.

In some examples, at first, the amount of charge being released to local reference signal 425 exceeds the amount of charge being drawn from local reference signal 425, and the voltage of local reference signal 425 rises. But, subsequently, the amount of charge being released to local reference signal 425 is overcome by the amount of charge being drawn from local reference signal 425, and the voltage of local reference signal 425 rises. In some examples, the separate rise and fall of local reference signal 425 may not exceed 1 millivolt (mV). As previously discussed, if the position of the enable and bias circuit are swapped, the kickback noise may cause changes in a local reference signal that exceed 8 mV in one direction. Once the capacitances are charged, the voltage of local reference signal 425 may be charged to the voltage of the global reference signal through a filter component (e.g., filter 340 of FIG. 3). In some examples, including a balancing resistor (e.g., balance resistor 385 of FIG. 3) in a path between local reference signal 425 and a gate of a bias transistor, reduces the amount that local reference signal 425 rises and/or falls (as depicted by the dotted lines in reference signal diagram 402).

Output signal 430 output by the regulator may exhibit transient behavior during the rise and fall of local reference signal 425. In some examples, a rise in voltage of output signal 430 may not exceed 25 mV. Additionally, a voltage of a global reference signal may change by less than 0.3 mV as a result of the transient behavior of local reference signal 425.

During loading period 415, one or more components in a memory device may draw power from the regulator. During loading period 415, a voltage of output signal 430 may decrease, however, the decrease may be attributed primarily to the loading and largely independent of kickback noise experienced by local reference signal 425. Once loading period ends, the voltage of output signal 430 may return to an initial voltage.

Figure 5:
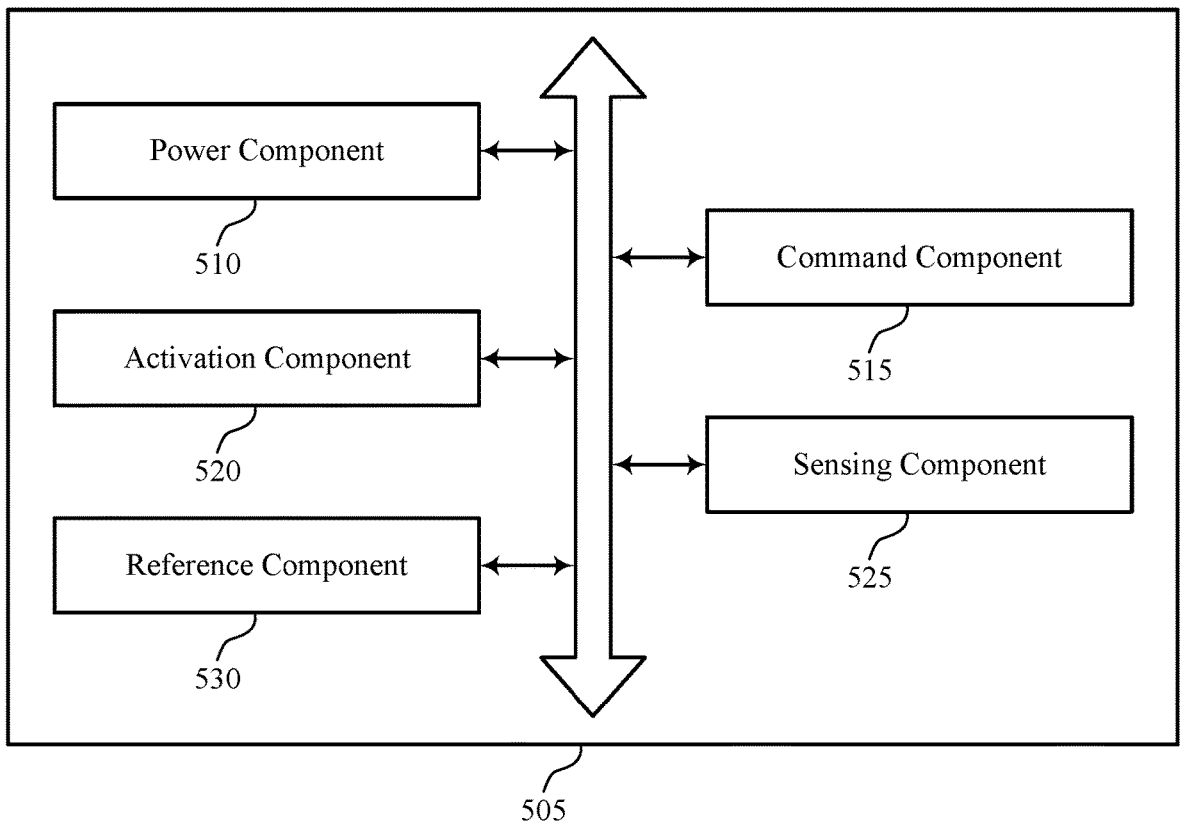
FIG. 5 shows a block diagram of a controller that supports compensating for kickback noise in accordance with examples as disclosed herein.

FIG. 5 shows a block diagram 500 of a controller 505 that supports compensating for kickback noise in accordance with examples as disclosed herein. The controller 505 may be an example of aspects of a memory array as described with reference to FIGS. 1 through 4. The controller 505 may include a power component 510, a command component 515, an activation component 520, a sensing component 525, and a reference component 530. Each of these modules may communicate, directly or indirectly, with one another (e.g., via one or more buses).

The power component 510 may power a memory device including a memory array and a regulator having a first transistor for receiving a reference signal, a second transistor for biasing the regulator, and a third transistor for enabling an operation of the regulator, where a voltage of a first node that is coupled with the first transistor and the third transistor has a first level and a voltage of a second node that is coupled with the second transistor and the third transistor has a second level based on the memory device being powered and the third transistor being deactivated.

The command component 515 may receive a command to activate a section of the memory array that is coupled with the regulator based on the memory device being powered.

The activation component 520 may activate the second transistor based on the command, where, based on activating the second transistor, a voltage of the first node and a voltage of the second node have a third level that is between the first level and the second level and the regulator generates a power signal for one or more sensing components in the section of the memory array.

The sensing component 525 may sense a logic state stored by a memory cell that is coupled with the one or more sensing components based on the second transistor being activated.

The reference component 530 may apply the reference signal to an input of the regulator based on the memory device being powered. In some examples, the reference component 530 may apply the reference signal to a low pass filter that is coupled with the regulator based on the memory device being powered, where the low pass filter outputs a filtered version of the reference signal to an input of the regulator.

In some examples, a first amount of charge travels through a gate of the first transistor based on the voltage of the first node transitioning from the first level to the third level. In some cases, a second amount of charge travels through a gate of the second transistor in an opposite direction as the first amount of charge based on the voltage of the second node transitioning from the second level to the third level.

Figure 6:
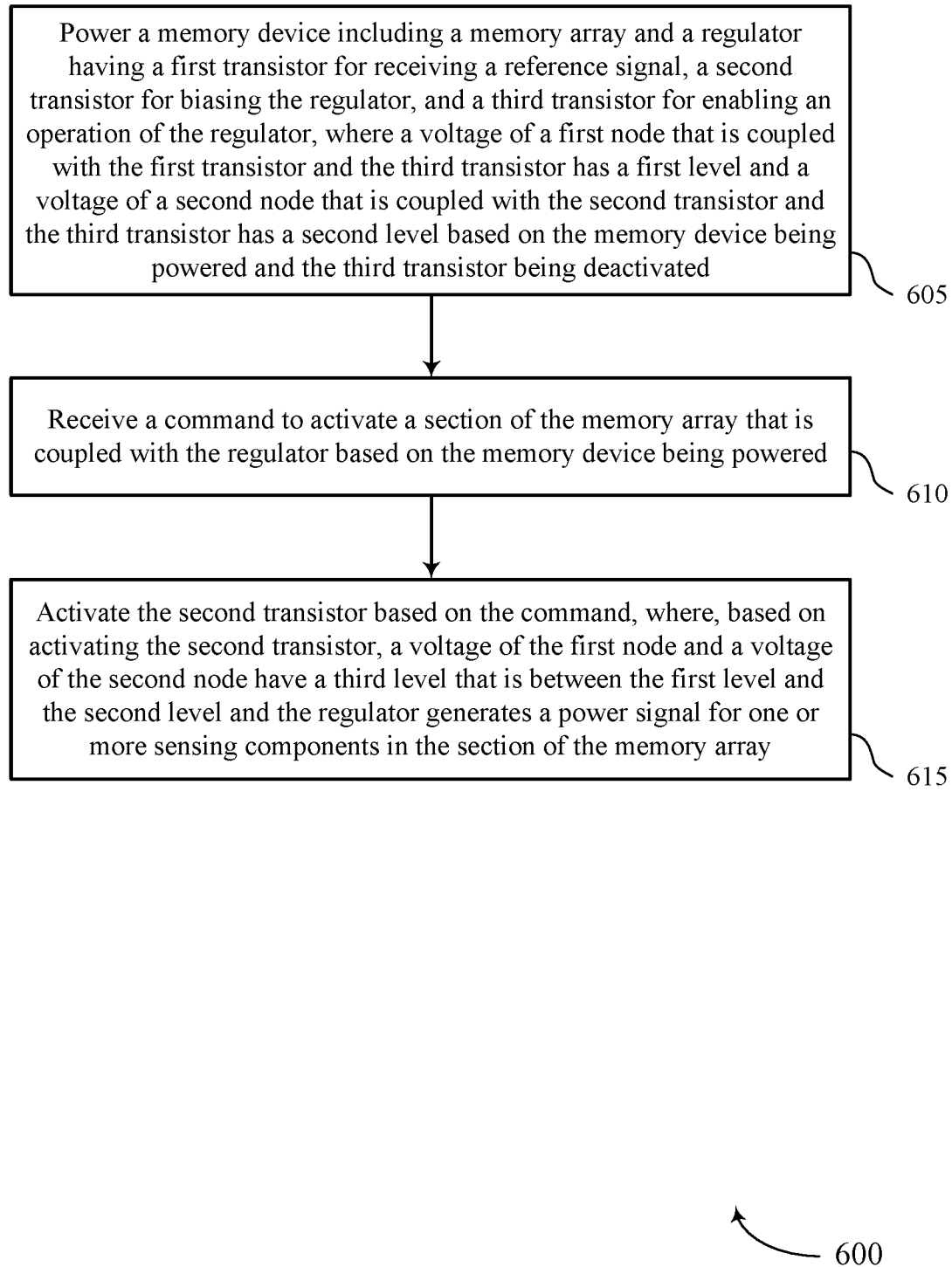
FIG. 6 shows a flowchart illustrating a method or methods that support compensating for kickback noise in accordance with examples as disclosed herein.

FIG. 6 shows a flowchart illustrating a method or methods 600 that supports compensating for kickback noise in accordance with examples as disclosed herein. The operations of method 600 may be implemented by a memory device or its components as described herein. For example, the operations of method 600 may be performed by a memory device as described with reference to FIG. 5. In some examples, a memory device may execute a set of instructions to control the functional elements of the memory array to perform the described functions. Additionally, or alternatively, a memory device may perform aspects of the described functions using special-purpose hardware.

At 605, the memory device may power a memory device including a memory array and a regulator having a first transistor for receiving a reference signal, a second transistor for biasing the regulator, and a third transistor for enabling an operation of the regulator, where a voltage of a first node that is coupled with the first transistor and the third transistor has a first level and a voltage of a second node that is coupled with the second transistor and the third transistor has a second level based on the memory device being powered and the third transistor being deactivated. The operations of 605 may be performed according to the methods described herein. In some examples, aspects of the operations of 605 may be performed by a power component as described with reference to FIG. 5.

At 610, the memory device may receive a command to activate a section of the memory array that is coupled with the regulator based on the memory device being powered. The operations of 610 may be performed according to the methods described herein. In some examples, aspects of the operations of 610 may be performed by a command component as described with reference to FIG. 5.

At 615, the memory device may activate the second transistor based on the command, where, based on activating the second transistor, a voltage of the first node and a voltage of the second node have a third level that is between the first level and the second level and the regulator generates a power signal for one or more sensing components in the section of the memory array. The operations of 615 may be performed according to the methods described herein. In some examples, aspects of the operations of 615 may be performed by an activation component as described with reference to FIG. 5.

In some examples, an apparatus as described herein may perform a method or methods, such as the method 600. In some examples, the apparatus may include a memory device including a memory array having a set of sections, a regulator coupled with one or more sensing components included in a section of the set of sections and including a first transistor for receiving a reference signal, a second transistor for biasing the regulator, a third transistor for enabling an operation of the regulator, a first node that is coupled with the first transistor and the third transistor, and a second node that is coupled with the second transistor and the third transistor, a controller coupled with the memory device.

The apparatus may include features, means, or instructions (e.g., a non-transitory computer-readable medium storing instructions executable by a processor) for powering the memory device, where a voltage of the first node transitions to a first level and a voltage of the second node transitions to a second level, receiving a command to activate the section of the memory array that is coupled with the regulator, and activating the second transistor of the regulator based on the command, where a voltage of the first node and a voltage of the second node transitions to a third level that is between the first level and the second level and the regulator generates a power signal for the one or more sensing components based on activating the second transistor.

Some examples of the method 600 and the apparatus described herein may further include operations, features, means, or instructions for sensing a logic state stored by a memory cell that may be coupled with the one or more sensing components based on the second transistor being activated.

Some examples of the method 600 and the apparatus described herein may further include operations, features, means, or instructions for applying the reference signal to an input of the regulator based on the memory device being powered.

Some examples of the method 600 and the apparatus described herein may further include operations, features, means, or instructions for applying the reference signal to a low pass filter that may be coupled with the regulator based on the memory device being powered, where the low pass filter outputs a filtered version of the reference signal to an input of the regulator.

In some examples of the method 600 and the apparatus described herein, a first amount of charge travels through a gate of the first transistor based on the voltage of the first node transitioning from the first level to the third level, and a second amount of charge travels through a gate of the second transistor in an opposite direction as the first amount of charge based on the voltage of the second node transitioning from the second level to the third level.

It should be noted that the methods described herein are possible implementations, and that the operations and the steps may be rearranged or otherwise modified and that other implementations are possible. Furthermore, portions from two or more of the methods may be combined.

Figure 7:
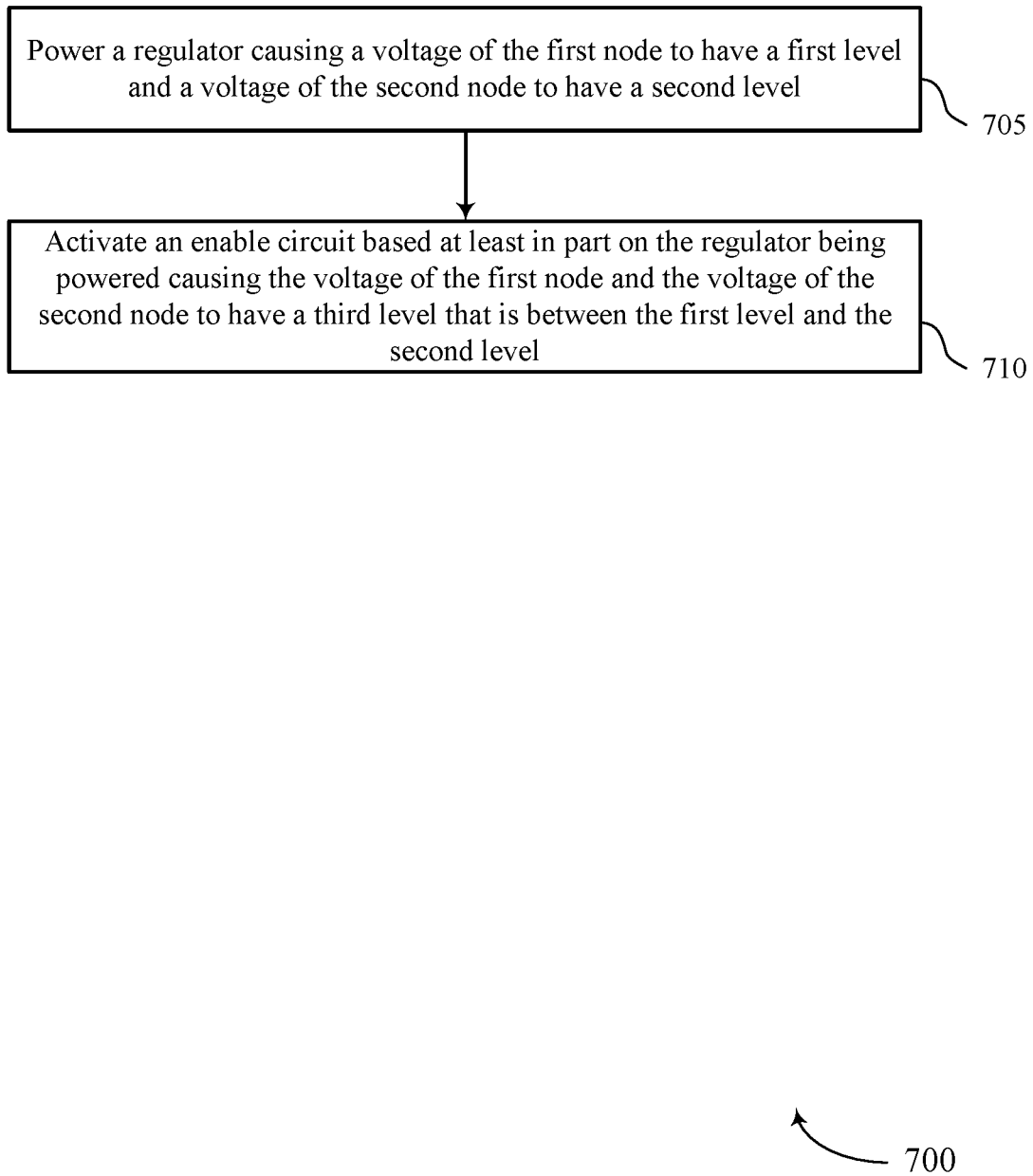
FIG. 7 shows a flowchart illustrating a method or methods that support compensating for kickback noise in accordance with examples as disclosed herein.

FIG. 7 shows a flowchart illustrating a method or methods 700 that supports compensating for kickback noise in accordance with examples as disclosed herein. The operations of method 700 may be implemented by a device array or its components as described herein. For example, the operations of method 700 may be performed by a memory array as described with reference to FIG. 5. In some examples, a memory device may execute a set of instructions to control the functional elements of the memory device to perform the described functions. Additionally, or alternatively, a memory device may perform aspects of the described functions using special-purpose hardware.

At 705, the memory device may power a regulator causing a voltage of the first node to have a first level and a voltage of the second node to have a second level. The operations of 705 may be performed according to the methods described herein. In some examples, aspects of the operations of 705 may be performed by a power component as described with reference to FIG. 5.

At 710, the memory device may activate an enable circuit based at least in part on the regulator being powered causing the voltage of the first node and the voltage of the second node to have a third level that is between the first level and the second level. The operations of 710 may be performed according to the methods described herein. In some examples, aspects of the operations of 710 may be performed by an activation component as described with reference to FIG. 5.

An apparatus is described. The apparatus may include a memory array including one or more components and a regulator coupled with the memory array and configured to generate a signal for the memory array based on a reference signal, the regulator including an input circuit configured to receive the reference signal at an input node, a biasing circuit coupled with the input node and configured to bias the regulator based on the reference signal, and an enable circuit coupled with the input circuit via a first node and the biasing circuit via a second node, the enable circuit configured to enable an operation of the regulator and configured to reduce noise at the input node that is based on the operation of the regulator being enabled.

Some examples of the apparatus may include a signal generator coupled with the regulator and configured to generate a global reference signal, and a low pass filter coupled with the input node of the regulator and the signal generator and configured to filter out transients in the global reference signal to obtain the reference signal.

In some examples, the low pass filter includes a capacitor and a resistor based on the enable circuit being coupled with the input circuit and the biasing circuit.

In some examples, the capacitor may have a capacitance of 7 pF, 8 pF, 9 pF, 10 pF, 11 pF, or between 7 pF and 11 pF, and the resistor may have a resistance between 1Ω and 15 kΩ.

In some examples, the input circuit includes a first transistor having a gate coupled with the input node of the regulator, the biasing circuit includes a second transistor having a gate coupled with the input node of the regulator, and the enable circuit includes a third transistor having a gate that may be coupled with an enable node of the regulator, a source that may be coupled with a drain of the third transistor, and a drain that may be coupled with the source of the first transistor and the source of the second transistor.

In some examples, a position of the third transistor between the first transistor and the second transistor may be configured to bias the first node to a first voltage and bias the second node to a second voltage when the third transistor may be deactivated and the reference signal may be being received at the input node.

In some examples, the enable circuit may be further configured to receive an enable signal that activates the third transistor and bias the first node and the second node a third voltage that may be between the first voltage and the second voltage.

In some examples, the enable circuit may be further configured to receive an enable signal that causes a first amount of charge to travel through a gate of the first transistor and a second amount of charge to travel through a gate of the second transistor in an opposite direction as the first amount of charge.

In some examples, the regulator may further include a resistor coupled with the input node and the gate of the second transistor, where a resistance of the resistor may be configured to cause a third amount of charge to travel through the gate of the second transistor instead of the second amount of charge, a difference between the first amount of charge and the third amount of charge being associated with an amount of noise caused by the regulator being enabled that may be below a threshold.

In some examples, the second transistor includes dimensions that may be configured to cause a third amount of charge to travel through the gate of the second transistor instead of the second amount of charge, a difference between the first amount of charge and the third amount of charge being associated with an amount of noise caused by the regulator being enabled that may be below a threshold.

In some examples, the input circuit may include a first transistor having a gate coupled with the input node of the regulator and a source, and a second transistor having a gate coupled with an output node of the regulator and a source coupled with the source of the first transistor.

In some examples, the biasing circuit may include a third transistor having a gate coupled with the input node of the regulator and a source, and a resistor that may be coupled between the source of the third transistor and a voltage source, where a resistance of the resistor may be configured to bias the regulator based on a voltage of the reference signal.

In some examples, the enable circuit may include a fourth transistor having a gate that may be coupled with an enable node of the regulator, a source that may be coupled with a drain of the third transistor, and a drain that may be coupled with the source of the first transistor and the source of the second transistor.

An apparatus is described. The apparatus may include a memory array including a set of memory sections and a set of regulators coupled with the set of memory sections, where a regulator of the set of regulators includes a first transistor coupled with an input node and configured to receive a reference signal, a second transistor coupled with the input node and configured to bias the regulator based on the reference signal, and a third transistor coupled with the first transistor via a first node and coupled with the second transistor via a second node, the third transistor configured to enable an operation of the regulator based on receiving an enable signal at a gate of the third transistor.

In some examples, a memory section of the set of memory sections includes one or more sensing components coupled with one or more memory cells, and the regulator of the set of regulators may be coupled with the memory section and configured to generate a power signal for the one or more sensing components.

Some examples of the apparatus may include a signal generator configured to generate a global reference signal for the set of regulators, and a set of low pass filters coupled with the set of regulators and the signal generator, where the set of low pass filters may be configured to receive the global reference signal.

In some examples, the set of low pass filters may be further configured to generate a set of local reference signals for the set of regulators, each low pass filter of the set of low pass filters being configured to generate a local reference signal for a respective regulator of the set of regulators.

In some examples, the set of low pass filters may be further configured to protect the global reference signal from transients in a set of local reference signals and to protect the set of local reference signals from transients in the global reference signal.

An apparatus is described. The apparatus may include a memory array including one or more sensing components and a regulator coupled with the memory array and configured to generate a power signal for the one or more sensing components based on a reference signal associated with the one or more sensing components, the regulator including a differential input circuit configured to receive the reference signal and an output of the regulator, a biasing circuit configured to bias the regulator in an operational state, an enable circuit coupled with the differential input circuit and the biasing circuit and configured to couple the differential input circuit with the biasing circuit based on an enable signal for the regulator, where a first node of the regulator is coupled with the differential input circuit and the enable circuit, and a second node of the regulator is coupled with the biasing circuit and the enable circuit, a controller coupled with the regulator and configured to cause the apparatus to, power the regulator causing a voltage of the first node to have a first level and a voltage of the second node to have a second level, and activate the enable circuit based on the regulator being powered causing the voltage of the first node and the voltage of the second node to have a third level that is between the first level and the second level.

In some examples, the differential input circuit may include operations, features, means, or instructions for applying the reference signal to the first input node of the regulator based on the regulator being powered.

In some examples, the differential input circuit may include operations, features, means, or instructions for a first transistor having a gate and a source, the gate of the first transistor being configured to receive the reference signal, and a second transistor having a gate and a source, the gate of the second transistor being configured to receive a signal output by the regulator and the source of the second transistor being coupled with the source of the first transistor and the first node of the regulator, where the regulator may be configured to match a voltage of an output signal applied at the gate of the second transistor with a voltage of the reference signal applied at the gate of the first transistor.

In some examples, the biasing circuit may include a third transistor having a gate that may be configured to receive the reference signal, and a resistor coupled with a source of the third transistor and a voltage rail, where a first amount of charge travels through the gate of the first transistor and a second amount of charge travels through the gate of the third transistor in an opposite direction as the first amount of charge based on the enable circuit being activated.

In some examples, the biasing circuit further may include a second resistor positioned between a gate of the first transistor and a gate of the third transistor and configured to reduce the second amount of charge.

In some examples, a width and a length of the second transistor may be configured so that a difference between the first amount of charge and the second amount of charge that may be associated with an amount of noise caused by the regulator being enabled that may be below a threshold.

Some examples of the apparatus may include a low pass filter that may be coupled with the regulator and includes a capacitor that may be coupled with the differential input circuit and a voltage rail, the low pass filter configured to filter out transients in the reference signal.

Some examples of the apparatus may include a voltage source, and a transistor having a drain and a source, the drain of the transistor being coupled with the differential input circuit and the source being coupled with a voltage rail that may be coupled with the voltage source, where, to cause the apparatus to power the regulator, the controller may be configured to cause the apparatus to activate the voltage source.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
    a memory array comprising one or more components; and
    a regulator coupled with the memory array and configured to generate a signal for the memory array based at least in part on a reference signal, the regulator comprising:
        an input circuit configured to receive the reference signal at an input node of the regulator, wherein the input circuit comprises a first transistor having a gate coupled with the input node of the regulator and a source and a second transistor having a gate coupled with an output node of the regulator and a source coupled with the source of the first transistor;
        a biasing circuit coupled with the input node of the regulator and configured to bias the regulator based at least in part on the reference signal; and
        an enable circuit coupled with the input circuit via a first node and the biasing circuit via a second node, the enable circuit configured to enable an operation of the regulator and configured to reduce noise at the input node of the regulator that is based at least in part on the operation of the regulator being enabled.

2. The apparatus of claim 1, further comprising:
    a signal generator coupled with the regulator and configured to generate a global reference signal; and
    a low pass filter coupled with the input node of the regulator and the signal generator and configured to filter out transients in the global reference signal to obtain the reference signal.

3. The apparatus of claim 2, wherein the low pass filter comprises a capacitor and a resistor based at least in part on the enable circuit being coupled with the input circuit and the biasing circuit.

4. The apparatus of claim 3, wherein:
    the capacitor has a capacitance of 7 picofarads, 8 picofarads, 9 picofarads, 10 picofarads, 11 picofarads, or between 7 picofarads and 11 picofarads; and
    the resistor has a resistance between 1 ohm and 15 kiloohms.

5. The apparatus of claim 1, wherein the biasing circuit comprises:
    a third transistor having a gate coupled with the input node of the regulator and a source; and
    a resistor that is coupled between the source of the third transistor and a voltage source, wherein a resistance of the resistor is configured to bias the regulator based at least in part on a voltage of the reference signal.

6. The apparatus of claim 5, wherein the enable circuit comprises:
    a fourth transistor having a gate that is coupled with an enable node of the regulator, a source that is coupled with a drain of the third transistor, and a drain that is coupled with the source of the first transistor and the source of the second transistor.

7. The apparatus of claim 1, wherein the memory array comprises a plurality of memory sections, and wherein the apparatus further comprises:
    a plurality of regulators coupled with the plurality of memory sections, wherein the plurality of regulators comprises the regulator.

8. The apparatus of claim 7, wherein:
    a memory section of the plurality of memory sections comprises one or more sensing components coupled with one or more memory cells, and
    the regulator is coupled with the memory section and configured to generate a power signal for the one or more sensing components.

9. The apparatus of claim 7, further comprising:
a signal generator configured to generate a global reference signal for the plurality of regulators; and
a plurality of low pass filters coupled with the plurality of regulators and the signal generator, wherein the plurality of low pass filters are configured to receive the global reference signal.

10. The apparatus of claim 9, wherein the plurality of low pass filters are further configured to generate a plurality of local reference signals for the plurality of regulators, each low pass filter of the plurality of low pass filters being configured to generate a local reference signal for a respective regulator of the plurality of regulators.

11. The apparatus of claim 9, wherein the plurality of low pass filters are further configured to protect the global reference signal from transients in a plurality of local reference signals and to protect the plurality of local reference signals from transients in the global reference signal.

12. An apparatus, comprising:
a memory array comprising one or more components; and
a regulator coupled with the memory array and configured to generate a signal for the memory array based at least in part on a reference signal, the regulator comprising:
an input circuit configured to receive the reference signal at an input node of the regulator, wherein the input circuit comprises a first transistor having a gate coupled with the input node of the regulator;
a biasing circuit coupled with the input node of the regulator and configured to bias the regulator based at least in part on the reference signal, wherein the biasing circuit comprises a second transistor having a gate coupled with the input node of the regulator; and
an enable circuit coupled with the input circuit via a first node and the biasing circuit via a second node, the enable circuit configured to enable an operation of the regulator and configured to reduce noise at the input node of the regulator that is based at least in part on the operation of the regulator being enabled, wherein the enable circuit comprises a third transistor having a gate that is coupled with an enable node of the regulator, a source that is coupled with a drain of the second transistor, and a drain that is coupled with a source of the first transistor.

13. The apparatus of claim 12, wherein a position of the third transistor between the first transistor and the second transistor is configured to bias the first node of the enable circuit to a first voltage and bias the second node of the enable circuit to a second voltage when the third transistor is deactivated and the reference signal is being received at the input node of the regulator.

14. The apparatus of claim 13, wherein the enable circuit is further configured to receive an enable signal that activates the third transistor and to bias the first node of the enable circuit and the second node of the enable circuit at a third voltage that is between the first voltage and the second voltage.

15. The apparatus of claim 13, wherein the enable circuit is further configured to receive an enable signal that causes a first amount of charge to travel through a gate of the first transistor and a second amount of charge to travel through a gate of the second transistor in an opposite direction as the first amount of charge.

16. The apparatus of claim 15, wherein the regulator further comprises:
a resistor coupled with the input node of the regulator and the gate of the second transistor, wherein a resistance of the resistor is configured to cause a third amount of charge to travel through the gate of the second transistor instead of the second amount of charge, a difference between the first amount of charge and the third amount of charge being associated with an amount of noise caused by the regulator being enabled that is below a threshold.

17. The apparatus of claim 15, wherein the second transistor comprises dimensions that are configured to cause a third amount of charge to travel through the gate of the second transistor instead of the second amount of charge, a difference between the first amount of charge and the third amount of charge being associated with an amount of noise caused by the regulator being enabled that is below a threshold.

18. An apparatus, comprising:
a memory array comprising one or more sensing components;
a regulator coupled with the memory array and configured to generate a power signal for the one or more sensing components based at least in part on a reference signal associated with the one or more sensing components, the regulator comprising:
a differential input circuit configured to receive the reference signal at an input node of the regulator and to receive an output signal of the regulator at an output node of the regulator, wherein the differential input circuit comprises a first transistor having a gate that is coupled with the input node of the regulator and a source and a second transistor having a gate coupled with the output node of the regulator and a source coupled with the source of the first transistor,
a biasing circuit coupled with the input node of the regulator and configured to bias the regulator in an operational state based at least in part on the reference signal, and
an enable circuit coupled with the differential input circuit via a first node and the biasing circuit via a second node and configured to couple the differential input circuit with the biasing circuit based at least in part on an enable signal for the regulator, wherein the first node of the enable circuit is coupled with the differential input circuit and the enable circuit, and the second node of the enable circuit is coupled with the biasing circuit and the enable circuit, and wherein the enable circuit is configured to enable an operation of the regulator and configured to reduce noise at the input node of the regulator that is based at least in part on the operation of the regulator being enabled; and
a controller coupled with the regulator and configured to cause the apparatus to:
power the regulator to cause a voltage of the first node of the enable circuit to have a first level and a voltage of the second node of the enable circuit to have a second level; and
activate the enable circuit based at least in part on the regulator being powered to cause the voltage of the first node of the enable circuit and the voltage of the second node of the enable circuit to have a third level that is between the first level and the second level.

19. The apparatus of claim 18, wherein the differential input circuit comprises an input node that is coupled with the input node of the regulator, and wherein the controller is further configured to cause the apparatus to:

apply the reference signal to the input node of the regulator and to the input node of the differential input circuit based at least in part on the regulator being powered.

20. The apparatus of claim 18, wherein:
the first transistor of the differential input circuit is configured to receive the reference signal;
the second transistor of the differential input circuit is configured to receive a signal output by the regulator,
the source of the second transistor is coupled with the first node of the enable circuit, and
the regulator is configured to match a voltage of the output signal of the regulator applied at the gate of the second transistor with a voltage of the reference signal applied at the gate of the first transistor.

21. The apparatus of claim 18, further comprising:
a low pass filter that is coupled with the regulator and comprises a capacitor that is coupled with the differential input circuit and a voltage rail, the low pass filter configured to filter out transients in the reference signal.

22. The apparatus of claim 18, further comprising:
a voltage source; and
a transistor having a drain and a source, the drain of the transistor being coupled with the differential input circuit and the source being coupled with a voltage rail that is coupled with the voltage source, wherein, to cause the apparatus to power the regulator, the controller is configured to cause the apparatus to activate the voltage source.

23. An apparatus, comprising:
a memory array comprising one or more sensing components;
a regulator coupled with the memory array and configured to generate a power signal for the one or more sensing components based at least in part on a reference signal associated with the one or more sensing components, the regulator comprising:
a differential input circuit configured to receive the reference signal and an output of the regulator, wherein the differential input circuit comprises a first transistor having a gate and having a source, the gate of the first transistor being configured to receive the reference signal and comprises a second transistor having a gate and having a source, the gate of the second transistor being configured to receive a signal output by the regulator and the source of the second transistor being coupled with the source of the first transistor, wherein the regulator is configured to match a voltage of an output signal applied at the gate of the second transistor with a voltage of the reference signal applied at the gate of the first transistor,
a biasing circuit configured to bias the regulator in an operational state, wherein the biasing circuit comprises a third transistor having a gate that is configured to receive the reference signal and comprises a resistor coupled with a source of the third transistor and a voltage rail, wherein a first amount of charge travels through the gate of the first transistor and a second amount of charge travels through the gate of the third transistor in an opposite direction as the first amount of charge based at least in part on an enable circuit being activated, and
the enable circuit coupled with the differential input circuit and the biasing circuit and configured to couple the differential input circuit with the biasing circuit based at least in part on an enable signal for the regulator, wherein a first node of the enable circuit is coupled with the differential input circuit and the enable circuit, and a second node of the enable circuit is coupled with the biasing circuit and the enable circuit; and
a controller coupled with the regulator and configured to cause the apparatus to:
power the regulator causing a voltage of the first node of the enable circuit to have a first level and a voltage of the second node of the enable circuit to have a second level; and
activate the enable circuit based at least in part on the regulator being powered causing the voltage of the first node of the enable circuit and the voltage of the second node of the enable circuit to have a third level that is between the first level and the second level.

24. The apparatus of claim 23, wherein the biasing circuit further comprises:
a second resistor positioned between the gate of the first transistor and the gate of the third transistor and configured to reduce the second amount of charge.

25. The apparatus of claim 23, wherein a width and a length of the second transistor are configured so that a difference between the first amount of charge and the second amount of charge that is associated with an amount of noise caused by the regulator being enabled that is below a threshold.

26. An apparatus, comprising:
a memory device comprising:
a memory array having a plurality of sections, and
a regulator coupled with one or more sensing components included in a section of the plurality of sections and comprising a first transistor for receiving a reference signal, a second transistor for biasing the regulator, a third transistor for enabling an operation of the regulator, a first node that is coupled with the first transistor and the third transistor, and a second node that is coupled with the second transistor and the third transistor; and
a controller coupled with the memory device and configured to cause the apparatus to:
power the memory device, wherein a voltage of the first node transitions to a first level and a voltage of the second node transitions to a second level;
receive a command to activate the section of the memory array that is coupled with the regulator; and
activate the second transistor of the regulator based at least in part on the command, wherein the voltage of the first node and the voltage of the second node transitions to a third level that is between the first level and the second level and the regulator generates a power signal for the one or more sensing components based at least in part on activating the second transistor.

27. The apparatus of claim 26, wherein the controller is further configured to cause the apparatus to:
sense a logic state stored by a memory cell that is coupled with the one or more sensing components based at least in part on the second transistor being activated.

28. The apparatus of claim 26, wherein the controller is further configured to cause the apparatus to:
apply the reference signal to an input of the regulator based at least in part on the memory device being powered.

* * * * *